(12) United States Patent
Nomura et al.

(10) Patent No.: US 8,288,282 B2
(45) Date of Patent: Oct. 16, 2012

(54) POLISHING LIQUID FOR METAL AND METHOD OF POLISHING

(75) Inventors: Yutaka Nomura, Hitachi (JP); Masato Fukasawa, Hitachi (JP); Hiroshi Nakagawa, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 80 days.

(21) Appl. No.: 12/670,292

(22) PCT Filed: Jul. 28, 2008

(86) PCT No.: PCT/JP2008/063535
§ 371 (c)(1),
(2), (4) Date: Jan. 22, 2010

(87) PCT Pub. No.: WO2009/017095
PCT Pub. Date: Feb. 5, 2009

(65) Prior Publication Data
US 2010/0197201 A1    Aug. 5, 2010

(30) Foreign Application Priority Data
Jul. 30, 2007  (JP) .............................. P2007-197349

(51) Int. Cl.
*C09K 13/00* (2006.01)
(52) U.S. Cl. ......... 438/692; 510/175; 134/1.3; 252/79.1
(58) Field of Classification Search ................. 252/79.1; 510/175; 134/1.3; 438/692
See application file for complete search history.

(56) References Cited

U.S. PATENT DOCUMENTS

| 4,944,836 | A | 7/1990 | Beyer et al. |
| 5,770,095 | A | 6/1998 | Sasaki et al. |
| 6,821,897 | B2 * | 11/2004 | Schroeder et al. ............ 438/692 |
| 6,896,825 | B1 * | 5/2005 | Uchida et al. ................. 252/79.1 |
| 8,038,898 | B2 * | 10/2011 | Uchida et al. ..................... 216/88 |
| 2005/0037693 | A1 * | 2/2005 | Uchikura et al. ............... 451/41 |
| 2005/0136671 | A1 | 6/2005 | Goldberg et al. |
| 2005/0181609 | A1 * | 8/2005 | Kurata et al. ................. 438/689 |
| 2006/0075688 | A1 * | 4/2006 | Takenouchi .................... 51/307 |

(Continued)

FOREIGN PATENT DOCUMENTS

JP    02-278822    11/1990

(Continued)

OTHER PUBLICATIONS

F. B. Kaufman et al.; Chemical-Machanical Polishing for Fabricating Patterned W Metal Features as Chip Interconnects; J. Electrochemical Society, Inc., Nov. 11, 1991; pp. 3460-3465; vol. 138, No. 11.

(Continued)

*Primary Examiner* — Gregory Webb
(74) *Attorney, Agent, or Firm* — Antonelli, Terry, Stout & Kraus, LLP.

(57) ABSTRACT

Disclosed is a metal-polishing liquid comprising: a metal-oxide-dissolving agent; a metal-oxidizing agent; a metal anti-corrosive; a water-soluble polymer having a weight-average molecular weight of 8,000 or higher and having an anionic functional group and a nonionic functional group; and water, and having a pH within the range of 2.5 or higher but 5.0 or less. The metal-polishing liquid is effective in reducing the frictional force in polishing which generates during CMP. And is highly effective in flattening the surface of a work to be polished.

22 Claims, 3 Drawing Sheets

U.S. PATENT DOCUMENTS

| | | | | |
|---|---|---|---|---|
| 2006/0214133 A1* | 9/2006 | Yamashita | ................. | 252/186.1 |
| 2006/0216936 A1* | 9/2006 | Akatsuka | ...................... | 438/691 |
| 2007/0200089 A1* | 8/2007 | Inaba et al. | ................... | 252/79.1 |
| 2008/0148649 A1* | 6/2008 | Liu | ................................. | 51/298 |
| 2008/0248727 A1* | 10/2008 | Shindo et al. | ................... | 451/36 |
| 2009/0064597 A1* | 3/2009 | Etoh et al. | ........................ | 51/298 |
| 2009/0289217 A1* | 11/2009 | Sato et al. | .................... | 252/79.4 |
| 2010/0155654 A1* | 6/2010 | Etoh et al. | .................... | 252/79.1 |

FOREIGN PATENT DOCUMENTS

| | | |
|---|---|---|
| JP | 8-83780 | 3/1996 |
| JP | 11-135466 | 5/1999 |
| JP | 2000-323444 | 11/2000 |
| JP | 2002-050595 | 2/2002 |
| JP | 2003-303792 | 10/2003 |
| JP | 2004-006628 | 1/2004 |
| JP | 2004-311565 | 11/2004 |
| JP | 2005-217396 | 8/2005 |
| WO | WO 2007/069488 A1 | 6/2007 |
| WO | WO 2007/077886 A1 | 7/2007 |

OTHER PUBLICATIONS

English translation of International Preliminary Report on Patentability dated Mar. 4, 2010.

Communication mailed Jul. 31, 2012, for a Taiwanese Patent Application; 4 pages; Taiwanese Patent Office, Taiwan.

* cited by examiner

POLISHING LIQUID FOR METAL AND METHOD OF POLISHING

TECHNICAL FIELD

The present invention relates to a metal-polishing liquid and a method for polishing a film to be polished.

BACKGROUND ART

In recent years, new microfabrication techniques have been developed to achieve more highly-integrated and higher-performance for semiconductor integrated circuits (hereinafter, referred to as "LSIs"). Chemical mechanical polishing (hereinafter, referred to as "CMP") is one of such techniques, and is frequently used for, for example, flattening interlayer insulating films, forming metal plugs, and embedding wiring in LSI production process, especially in the step of forming multilayer wiring (see, for example, U.S. Pat. No. 4,944,836).

Further, in order to achieve higher-performance LSIs, an attempt has recently been made to use, as wiring materials, copper-based metals such as copper, metal films mainly made of copper, and copper alloys (hereinafter, simply referred to as "copper-based metals"). However, it is difficult to microfabricate such copper-based metals by dry-etching generally used for forming conventional aluminum alloy wiring. For this reason, for example, a so-called damascene process is mainly employed, in which a thin film made of copper-based metal is deposited on an insulating film having previously-formed trenches to fill the trenches with the copper-based metal and then the thin film made of copper-based metal except for the trenches is removed by CMP to form embedded wiring (see, for example, Japanese Patent Application Laid-open No. 2-278822).

In a general metal CMP method for polishing a wiring metal, a polishing pad is bonded to a circular polishing table, the surface of the polishing pad is wetted with a metal-polishing liquid, a substrate having a metal film formed on the surface thereof is pressed against the polishing pad so that the metal film comes into contact with the polishing pad, the polishing table is rotated while a predetermined pressure (hereinafter, referred to as "polishing load") is applied from the back surface thereof to remove convexes of the metal film by mechanical friction between the polishing liquid and the convexes of the metal film.

A metal-polishing liquid for use in CMP generally contains an oxidizing agent and abrasive grains, and if necessary, further contains a metal-oxide-dissolving agent, a metal anticorrosive, etc. The basic mechanism of CMP is believed to be that the surface of a metal film formed on a substrate is first oxidized by oxidizing agent and then the thus obtained oxidized layer is scraped away by abrasive grains. The oxidized layer covering concaves of the metal film surface is less likely to come into contact with a polishing pad and therefore does not undergo abrasion by abrasive grains. Therefore, the convexes of the metal film are removed with progression of CMP so that the surface of the substrate is flattened (see, for example, Journal of Electrochemical Society, Vol. 138, No. 11, pp. 3460 to 3464 (1991)).

At first, a major problem of CMP was generation of deterioration in flatness caused by a phenomenon in which the central part of the surface of embedded metal wiring is recessed like a dish due to isotropic polishing (hereinafter, referred to as "dishing") or a phenomenon in which an interlayer insulating film is polished together with a wiring metal so that a recess is formed in the interlayer insulating film (hereinafter, referred to as "erosion"). In order to overcome such deterioration in flatness, a polishing method using a metal-polishing liquid containing a metal-oxide-dissolving agent composed of aminoacetic acid (glycine) or amidosulfuric acid and a protective film-forming agent such as benzotriazole has been proposed (see, for example, Japanese Patent Application Laid-open No. 8-83780). However, such a polishing method, wherein deterioration in flatness can be overcome due to the ability of the protective film-forming agent, such as benzotriazole, to form a protective film, is not always suitable because a polishing rate is significantly reduced.

Further, in order to solve problems such as dishing and erosion, for example, Japanese Patent No. 3371775 discloses a polishing liquid for copper-based metal, which contains substantially no abrasive grains. Japanese Patent No. 3371775 also discloses a technique for forming embedded metal wiring by mechanically polishing the surface of a metal film with the use of a polishing liquid containing an oxidizing substance for oxidizing a metal film to be polished, an organic acid for making an oxide formed by oxidization using the oxidizing substance water-soluble, and water, and if necessary, an anticorrosive (a protective film-forming agent). More specifically, Japanese Patent No. 3371775 discloses a method for forming copper wiring with the use of, for example, a polishing liquid containing substantially no abrasive grains but containing hydrogen peroxide, citric acid, and benzotriazole. However, such a method involves a problem in that a polishing rate under normal polishing conditions is in the range of 80 to 150 nm/min and the saturation of a polishing rate occurs so that a polishing rate does not exceed 200 nm/min even when a high polishing load of 300 g/cm$^2$ or higher is applied.

In order to solve such a problem, a polishing method has been proposed for forming embedded metal wiring by mechanically polishing the surface of a metal film with the use of a metal-polishing liquid containing substantially no abrasive grains but containing an oxidizing substance, phosphoric acid, an organic acid, a protective film-forming agent, and water (see Japanese Patent Application Laid-open No. 2002-50595). This method makes it possible to achieve an increased polishing rate (700 nm/min or higher) and to obtain a polished surface with dishing or erosion of about 50 nm or less. Polishing using such a polishing liquid as described above containing substantially no abrasive grains is performed mainly by friction with a polishing pad. Therefore, the polishing method using the polishing liquid is required to apply a high polishing load. For example, in the case of the above-described method, a polishing load of 220 g/cm$^2$ is applied.

In order to improve a polishing rate and the flatness of a polished surface, metal-polishing liquids containing an additive expressed as a surfactant or a water-soluble polymer have been proposed. However, it has been reported that such an additive is effective at improving a polishing rate and at the flatness of a polished surface but makes friction increase during polishing (see, for example, Japanese Patent Application Laid-open No. 2004-6628).

On the other hand, in order to achieve higher-performance LSIs, introduction of copper wiring and switching of an interlayer insulating film. That is, a conventional silicon oxide film is coming to switching to an insulating film having a low dielectric constant (Low-k film).

The use of a Low-k film as an insulating film makes it possible to achieve a lower parasitic capacitance between devices or wiring lines as compared to a case where a conventional silicon oxide film is used as an insulating film. Examples of such a Low-k film include inorganic films such as SiOF films and Si—H-containing SiO$_2$ films, organic-inorganic hybrid films such as carbon-containing $SiO_2$ (SiOC) films and methyl group-containing $SiO_2$ films, and organic polymer films such as Teflon®-based polymer films, polyimide-based polymer films, polyallyl ether-based polymer films, parylene-based polymer films, and wholly aromatic polymer films. For example, an organic-inorganic hybrid film made of methyl group-containing $SiO_2$: HSG2209S-R7 (trade name), which is manufactured by Hitachi Chemical Co., Ltd., has a relative dielectric constant of 2.8. Further, as for the example of the organic polymer film, SiLK (trade name), which is manufactured by Dow Chemical, as a wholly aromatic polymer is being contemplated for a material capable of achieving a relative dielectric constant of 2.6 to 2.8.

Further, a Low-k film having a lower relative dielectric constant is under study. For example, porous materials obtained by forming micropores in the above-mentioned materials are thought to be promising materials to achieve a relative dielectric constant of 2.5 or less.

However, such a Low-k film having a relative dielectric constant of 3 or less has low mechanical strength and shows poor adhesion to metal films or to other insulating films. Therefore, in the case of using such a Low-k film as an insulating film, there is a problem that cohesive failure of the Low-k film itself occurs or interface delamination occurs between the Low-k film and a film other than the Low-k film when a copper-based metal layer and a barrier layer are polished by CMP in a damascene process. It can be considered that such a problem is caused by a high polishing load or a high frictional force developed between a wafer and a polishing pad during CMP.

Further, in order to improve a polishing rate and the flatness of a polished surface, metal-polishing liquids containing an additive expressed as a surfactant or a water-soluble polymer have been proposed. However, it has been reported that such an additive is effective at improving a polishing rate and the flatness of a polished surface but increases friction during polishing (see, for example, Japanese Patent Application Laid-open No. 2004-6628).

As has been described above, such conventional polishing liquids for CMP are difficult to simultaneously satisfy two or more of the following requirements: to achieve a high polishing rate; to achieve high flatness of a polished surface; and to exhibit excellent performance even in the case of polishing the surface to be polished, having a film with low mechanical strength such as a Low-k film, and therefore there is room for improvement.

DISCLOSURE OF THE INVENTION

In view of the above problems, it is an object of the present invention to provide a metal-polishing liquid and a polishing method using the same capable of achieving a reduced frictional force during polishing by CMP and high flatness of a polished surface. It is another object of the present invention to avoid the occurrence of problems such as cohesive failure of a Low-k film itself and interface delamination between a Low-k film and a film other than the Low-k film so that embedded wiring with excellent flatness can be formed.

The present inventors have found that addition of a polymer having only an anionic functional group to a polishing liquid increases not only a polishing rate but also a frictional force so that a polished surface is poor in flatness. However, the present inventors have also found that the use of a polishing liquid having a pH within the range of 2.5 or higher but 5.0 or less and containing a water-soluble polymer having a weight-average molecular weight of 8,000 or higher and having an anionic functional group and a nonionic functional group makes it possible to reduce friction during CMP and to improve the flatness of a polished surface.

Accordingly, the present invention provides the following.

(1) A metal-polishing liquid comprising: a metal-oxide-dissolving agent; a metal-oxidizing agent; a metal anticorrosive; a water-soluble polymer having a weight-average molecular weight of 8,000 or higher and having an anionic functional group and a nonionic functional group; and water, and having a pH within the range of 2.5 or higher but 5.0 or less.

(2) The metal-polishing liquid according to the above (1), wherein the water-soluble polymer having an anionic functional group and a nonionic functional group has at least one anionic functional group selected from the group consisting of a sulfonic acid group, a carboxylic acid group, a phosphoric acid group, and salts thereof.

(3) The metal-polishing liquid according to the above (1) or (2), wherein the water-soluble polymer having an anionic functional group and a nonionic functional group has at least one nonionic functional group selected from the group consisting of an alcohol group, an amide group, an alkoxy group, a glycol group, and a lactam group.

(4) The metal-polishing liquid according to any one of the above (1) to (3), wherein the water-soluble polymer having an anionic functional group and a nonionic functional group has a ratio of the number of nonionic functional groups to the total number of functional groups of 5% or higher but 60% or less.

(5) The metal-polishing liquid according to any one of the above (1) to (4), wherein the metal-oxidizing agent is at least one selected from the group consisting of hydrogen peroxide, ammonium persulfate, nitric acid, potassium periodate, hypochlorous acid, and ozone water.

(6) The metal-polishing liquid according to any one of the above (1) to (5), wherein the metal-oxide-dissolving agent is at least one selected from the group consisting of inorganic acids, organic acids, and salts thereof having a first-step acid dissociation constant at 25° C. of less than 3.7.

(7) The metal-polishing liquid according to any one of the above (1) to (6), wherein the metal-oxide-dissolving agent is at least one selected from the group consisting of malonic acid, citric acid, malic acid, glycolic acid, glutamic acid, oxalic acid, tartaric acid, sulfuric acid, nitric acid, phosphoric acid, hydrochloric acid, formic acid, lactic acid, phthalic acid, fumaric acid, maleic acid, aminoacetic acid, amidosulfuric acid, and salts thereof.

(8) The metal-polishing liquid according to any one of the above (1) to (7), wherein the metal anticorrosive is at least one selected from the group consisting of nitrogen-containing cyclic compounds and ionic surfactants.

(9) The metal-polishing liquid according to any one of the above (1) to (8), further comprising abrasive grains.

(10) The metal-polishing liquid according to any one of the above (1) to (9), wherein the abrasive grains are grains of at least one selected from the group consisting of silica, alumina, ceria, titania, zirconia, germania, and organic polymers.

(11) The metal-polishing liquid according to any one of the above (1) to (10), which is used to polish at least one metal selected from the group consisting of copper, copper alloys, copper oxides, and copper alloy oxides.

(12) The metal polishing liquid according to any one of the above (1) to (11), which is used to polish at least one metal selected from the group consisting of tantalum, tantalum compounds, titanium, titanium compounds, tungsten, tungsten compounds, ruthenium, and ruthenium compounds.

(13) A method for polishing a film to be polished, comprising polishing a film to be polished by moving a polishing table and a substrate having a metal film to be polished relative to each other in a state where the substrate is pressed against a polishing cloth of the polishing table while supplying the metal-polishing liquid according to any one of the above (1) to (12) onto the polishing cloth.

According to the present invention, it is possible to provide a metal-polishing liquid and a polishing method using the same capable of achieving a reduced frictional force during polishing by CMP and high flatness of a polished surface. Further, it is also possible to avoid the occurrence of problems such as cohesive failure of a Low-k film itself and interface delamination between a Low-k film and a film other than the Low-k film, thereby enabling embedded wiring with excellent flatness and high reliability to be formed.

BEST MODE FOR CARRYING OUT THE INVENTION

Figure 1:
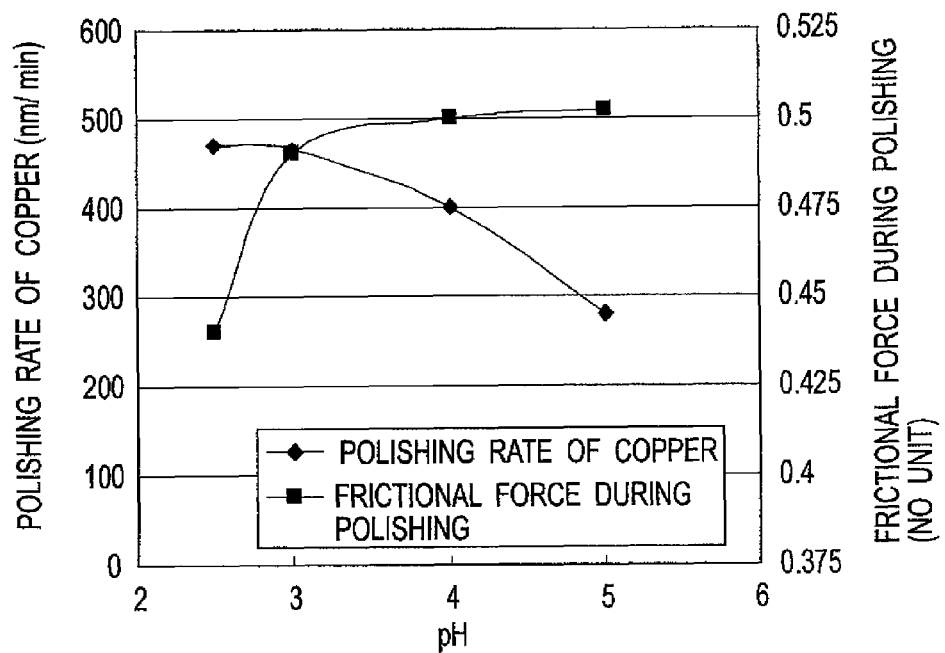
FIG. 1 is a graph obtained by plotting the relationship between the pH and a polishing rate, and the relationship between the pH and a frictional force during polishing by CMP when polishing was performed using the metal-polishing liquid containing a water-soluble polymer (weight-average molecular weight: 65,000) having a carboxylic acid group as an anionic functional group and having no nonionic functional group.

Hereinbelow, a metal-polishing liquid of the present invention will be described in detail.

The metal-polishing liquid of the present invention contains a metal-oxide-dissolving agent, a metal-oxidizing agent, a metal anticorrosive, a water-soluble polymer having a weight-average molecular weight of 8,000 or higher and having an anionic functional group and a nonionic functional group, and water, and has a pH within the range of 2.5 or higher but 5.0 or less.

It can be considered that the degree of ionic dissociation of an anionic functional group contained in a water-soluble polymer varies depending on the pH of the metal-polishing liquid. More specifically, it can be considered that when the pH of the metal-polishing liquid is low, ionic dissociation of the anionic functional group is suppressed, and on the other hand, when the pH of the metal-polishing liquid is high, ionic dissociation of the anionic functional group is promoted. Further, it can be considered that the interaction between a water-soluble polymer having an anionic functional group and a metal to be polished, and the interaction between a water-soluble polymer and its ion vary depending on the degree of ionic dissociation of the anionic functional group.

The ionic dissociation of an anionic functional group contained in the water-soluble polymer is thought to be promoted in a pH range of 2.5 or higher. The promotion of ionic dissociation of the anionic functional group tends to lower a polishing rate. However, in the metal-polishing liquid of the present invention, a polymer obtained by copolymerizing a monomer having an anionic functional group and a monomer having a nonionic functional group are used, and therefore a low frictional force during polishing, a high polishing rate, and high flatness of a polished surface can be achieved even at a pH of 2.5 or higher. This will be described later in detail.

Based on this standpoint, the pH of the metal-polishing liquid of the present invention is set to 2.5 or higher but 5.0 or less, but is preferably 3.0 or higher but 5.0 or less, more preferably 3.0 or higher but 4.5 or less, particularly preferably 3.0 or higher but 4.0 or less. If the pH of the metal-polishing liquid of the present invention exceeds 5.0, a polishing rate tends to be lowered. On the other hand, if the pH of the metal-polishing liquid of the present invention is less than 2.5, flatness of a polished surface tends to be poor due to an increase in the amount of etching, and a problem, such as corrosion of a wiring metal, resulting from that the pH of the metal-polishing liquid is within a strongly acidic range tends to occur.

The pH of the metal-polishing liquid can be adjusted by, for example, changing the kind of metal-oxide-dissolving agent to be added or controlling the amount of metal-oxide-dissolving agent to be added. Alternatively, the pH of the metal-polishing liquid may be adjusted by using a base such as ammonia or potassium hydroxide together with the metal-oxide-dissolving agent.

The pH in the present invention can be measured by a pH meter (e.g., Model pH 81 manufactured by Yokogawa Electric Corporation). More specifically, a two-point calibration is performed using standard buffer solutions (phthalate pH buffer solution: pH 4.21 (25° C.) and neutral phosphate pH buffer solution: pH 6.86 (25° C.)), and then an electrode is immersed in the metal-polishing liquid, and after a lapse of 2 minutes or longer, the stabilized pH of the metal-polishing liquid is measured.

The metal-oxide-dissolving agent to be used in the present invention is not particularly limited as long as it is water soluble. Specific examples of such a metal-oxide-dissolving agent include organic acids, organic acid esters, organic acid salts, inorganic acids, and inorganic acid salts. Among them, inorganic acids, organic acids, and salts thereof are preferred. As the salts, ammonium salts are preferable.

The metal-oxide-dissolving agent preferably has a first-step acid dissociation constant at 25° C. (hereinafter, also referred to as "pKa1") of less than 3.7. The pKa1 is more preferably 2.0 or higher but less than 3.7. When the pKa1 is 3.7 or less, a polishing rate tends to be achieved at practical-level within the pH range in the present invention.

Specific examples of the metal-oxide-dissolving agent include malonic acid, citric acid, malic acid, glycolic acid, glutamic acid, gluconic acid, oxalic acid, tartaric acid, picolinic acid, nicotinic acid, mandelic acid, acetic acid, sulfuric acid, nitric acid, phosphoric acid, hydrochloric acid, formic acid, lactic acid, phthalic acid, fumaric acid, maleic acid, aminoacetic acid and amidosulfuric acid, and ammonium salts or potassium salts thereof. These specific examples are preferred from the viewpoint of ease of balancing the metal-oxide-dissolving agent and a protective film-forming agent.

Among these specific examples, malonic acid, citric acid, malic acid, glycolic acid, glutamic acid, oxalic acid, tartaric acid, sulfuric acid, nitric acid, phosphoric acid, hydrochloric acid, formic acid, lactic acid, phthalic acid, fumaric acid, maleic acid, aminoacetic acid and amidosulfuric acid, and salts thereof are more preferred from the viewpoint of the balance between the metal-oxide-dissolving agent and a protective film-forming agent.

Among them, malic acid, tartaric acid, citric acid, phosphoric acid, and sulfuric acid are even more preferred, and malic acid, citric acid, phosphoric acid, and sulfuric acid are particularly preferred in that an etching rate can be effectively suppressed while a practical-level CMP rate is maintained. These metal-oxide-dissolving agents can be used singly or in combination of two or more of them.

The amount of the metal-oxide-dissolving agent in the present invention can be appropriately selected, but is preferably 0.05 to 3.0% by mass, more preferably 0.1 to 1.0% by mass relative to the total mass of the metal-polishing liquid. When the amount of the metal-oxide-dissolving agent is 0.05% by mass or more, a satisfactory polishing rate tends to be achieved. When the amount of the metal-oxide-dissolving agent is 3.0% by mass or less, practical-level flatness tends to be achieved.

Examples of the metal-oxidizing agent to be used in the present invention include hydrogen peroxide, nitric acid, potassium periodate, ammonium persulfate, hypochlorous acid, ozone water and the like. Among them, hydrogen peroxide is preferred. These metal-oxidizing agents can be used singly or in combination of two or more of them. In a case where a surface to be polished is a surface of a substrate (especially, a silicon substrate having semiconductor devices), an oxidizing agent containing no nonvolatile component is preferably used to prevent undesired contamination with, for example, alkali metals, alkaline-earth metals, and halides. Particularly, from the viewpoint of stability, hydrogen peroxide is preferred. On the other hand, in a case where a substrate, to which the present invention is applied, is a glass substrate or the like having no semiconductor devices, an oxidizing agent containing a nonvolatile component may be used.

The amount of the metal-oxidizing agent in the present invention can be appropriately selected, but is preferably 3 to 20% by mass, more preferably 5 to 15% by mass relative to the total mass of the metal polishing liquid. When the amount of the metal-oxidizing agent is 3% by mass or more, a satisfactory polishing rate tends to be achieved. Also, when the amount of the metal-oxidizing agent is 20% by mass or less, a satisfactory polishing rate tends to be achieved.

The metal anticorrosive to be used in the present invention is not particularly limited as long as it can prevent the dissolution of an oxidized layer in the metal-polishing liquid.

Specific examples of such a metal anticorrosive include: alkyl amines such as dimethylamine, trimethylamine, triethylamine and propylenediamine; amines such as ethylenediaminetetraacetate (EDTA), sodium diethyldithiocarbamate, and chitosan; imines such as dithizone, cuproin (2,2'-biquinoline), neocuproin (2,9-dimethyl-1,10-phenanthroline), bathocuproin (2,9-dimethyl-4,7-diphenyl-1,10-phenanthroline), and cuperazone (biscyclohexanoneoxalylhydrazone)); and nitrogen-containing cyclic compounds such as azoles (e.g., benzimidazole-2-thiol, triazine dithiol, triazine trithiol, 2-[2-(benzothiazolyl)]thiopropionic acid, 2-[2-(benzothiazolyl)]thiobutyric acid, 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, N-(1,2,3-benzotriazolyl-1-methyl)-N-(1,2,4-triazolyl-1-methyl)-2-ethylhexylamine, tolyltriazole, naphthotriazole, and bis[(1-benzotriazolyl)methyl]phosphonic acid); mercaptans such as nonylmercaptan and dodecylmercaptan; and ionic surfactants such as decylbenzenesulfonic acid and dodecylsulfuric acid and salts thereof.

Among these metal anticorrosives, from the viewpoint of achieving both a suppressed etching rate and a high polishing rate, nitrogen-containing cyclic compounds and ionic surfactants are preferred, and nitrogen-containing cyclic compounds are more preferred. The ionic surfactant having any one or more of a sulfonic acid group, a carboxylic acid group, a phosphoric acid group, and a phenolic hydroxyl group as an ionic group(s) and also having a hydrophobic group having 6 carbon atoms or more, are preferable. These metal anticorrosives can be used singly or in combination of two or more of them.

The amount of the metal anticorrosive in the present invention can be appropriately selected, but is preferably 0.05 to 3.0% by mass, more preferably 0.1 to 1.0% by mass relative to the total mass of the metal polishing liquid. When the amount of the metal anticorrosive is 0.05% by mass or more, etching tends to be suppressed due to its sufficient anticorrosion effect, thereby improving the flatness of a polished surface. When the amount of the metal anticorrosive is 3.0% by mass or less, a practical-level polishing rate tends to be achieved.

In the present invention, it is important to use the water-soluble polymer having a weight-average molecular weight of 8,000 or higher and having an anionic functional group and a nonionic functional group. This makes it possible to reduce friction during polishing by CMP, to achieve a high polishing rate, and to improve dishing.

If the weight-average molecular weight of the water-soluble polymer having an anionic functional group and a nonionic functional group is less than 8,000, a polishing rate is lowered. The weight-average molecular weight of the water-soluble polymer is preferably 8,000 or higher but 200,000 or less, more preferably 20,000 or higher but 100,000 or less, and particularly preferably 40,000 or higher but 80,000 or less. The upper limit of the weight-average molecular weight of the water-soluble polymer is not particularly limited. However, for example, if the weight-average molecular weight of the water-soluble polymer exceeds 200,000, it is not recognized that a polishing rate is significantly decreased, but the polishing rate tends to widely vary from place to place in a wafer surface to be polished to cause the amount of dishing tends to be increased.

The weight-average molecular weight of the water-soluble polymer to be used in the present invention having an anionic functional group and a nonionic functional group can be measured by gel permeation chromatography. The measurement conditions are as follows.

Pump: Model L-6000 (manufactured by Hitachi, Ltd.)
Detector: R1 detector L-3300 (manufactured by Hitachi, Ltd.)
Column: Gelpack GL-W500 (manufactured by Hitachi, Ltd.)
Column Size: 10.7 mm ($\phi$)×300 mm
Eluent: 100 mM phosphate buffer (pH 6.8)/acetonitrile=90/10 (vol %)
Liquid-Sending Pressure: 17 kgf/cm$^2$
Flow Rate of Eluent: 1.0 mL/min
Amount of Sample for Measurement: 50 μL,
Calibration Curve: polyethylene glycol/polyethylene oxide As has been described above, the water-soluble polymer to be used in the present invention has an anionic functional group and a nonionic functional group. The anionic functional group is preferably at least one selected from the group consisting of a sulfonic acid group, a carboxylic acid group, a phosphoric acid group, and salts thereof. Among them, a carboxylic acid group and salts thereof are more preferred.

Examples of the salt of the anionic functional group include alkali metal salts, alkaline-earth metal salts, halides, ammonium salts and the like. In a case where a substrate to be polished using the polishing liquid of the present invention is a silicon substrate for semiconductor integrated circuit, an ammonium salt is preferably used as the anionic functional group to prevent undesired contamination with alkali metals, alkaline-earth metals, and halides.

The water-soluble polymer contained in the metal-polishing liquid of the present invention has at least one kind of anionic functional group, and may have two or more kinds of anionic functional groups. Alternatively, the metal-polishing liquid of the present invention may use two or more kinds of water-soluble polymers having different anionic functional groups.

The nonionic functional group is preferably at least one selected from the group consisting of, for example, alcohol groups, amide groups, alkoxy groups, glycol groups, and lactam groups. Among them, alcohol groups, amide groups, alkoxy groups, and lactam groups are particularly preferred.

When an alkoxy group is selected as the nonionic functional group, an alkoxy group having 1 to 4 carbon atoms is preferred.

The water-soluble polymer contained in the metal-polishing liquid of the present invention has at least one kind of nonionic functional group, and may have two or more kinds of nonionic functional groups. Alternatively, the metal-polishing liquid of the present invention may use two or more kinds of water-soluble polymers having different nonionic functional groups.

Examples of a combination of the anionic functional group and the nonionic functional group of the water-soluble polymer contained in the metal-polishing liquid of the present invention include a combination of a carboxylic acid group and an alcohol group, a combination of a carboxylic acid group and an amide group, a combination of a carboxylic acid group and an alkoxy group, and a combination of a carboxylic acid group and a lactam group. These combinations are preferred from the viewpoint of achieving a high polishing rate and good flatness of a polished surface.

In the present invention, the water-soluble polymer having an anionic functional group and a nonionic functional group preferably has a ratio of the number of nonionic functional groups to the total number of functional groups of 5% or higher, more preferably 10% or higher, even more preferably 20% or higher from the viewpoint of obtaining the effect of reducing a frictional force during polishing. Further, the ratio of the number of nonionic functional groups to the total number of functional groups is preferably 60% or less, more preferably 50% or less, even more preferably 40% or less from the viewpoint of achieving a practical-level polishing rate.

In the case of a conventional metal-polishing liquid, a high polishing rate and a low frictional force during polishing can be achieved by lowering its pH, but there is a problem that a polished surface is poor in flatness. However, as described above, since in the metal-polishing liquid of the present invention, a polymer obtained by copolymerizing a monomer having an anionic functional group and a monomer having a nonionic functional group is used, thereby a low frictional force during polishing can be achieved even when its pH is not so low (i.e., in a pH within the range of 2.5 to 5.0). Therefore, the combination of the above-described pH range and the above-described water-soluble polymer makes it possible to obtain a metal-polishing liquid having such excellent properties that a low frictional force during polishing, a high polishing rate, and good flatness of a polished surface can be achieved.

The water-soluble polymer having an anionic functional group and a nonionic functional group can be produced based on a conventionally-known method. For example, a method in which a monomer having the above-mentioned anionic functional group and a monomer having the above-mentioned nonionic functional group are polymerized can be mentioned.

Specific examples of the monomer having an anionic functional group include: monomers having a carboxylic acid group such as (meth)acrylic acid, 2-carboxyethyl(meth)acrylate, crotonic acid, itaconic acid, maleic acid, fumaric acid, itaconic acid, monoalkyl itaconates (e.g., monomethyl itaconate, monoethyl itaconate), monoalkyl maleates (e.g., monomethyl maleate, monoethyl maleate), and citraconic acid; monomers having a sulfonic acid group such as vinyl sulfonic acid, styrenesulfonic acid, vinylbenzylsulfonic acid, acryloyloxyalkylsulfonic acids (e.g., acryloyloxymethylsulfonic acid, acryloyloxyethylsulfonic acid, acryloyloxypropylsulfonic acid), methacryloyloxyalkylsulfonic acids (e.g., metbacryloyloxymethylsulfonic acid, methacryloyloxyethylsulfonic acid, methacryloyloxypropylsulfonic acid), acrylamidealkylsulfonic acids (e.g., 2-acrylamide-2-methylethanesulfonic acid, 2-acrylamide-2-methylpropanesulfonic acid, 2-acrylamide-2-methylbutanesulfonic acid), and methacrylamidealkylsulfonic acids (e.g., 2-methacrylamide-2- methylethanesulfonic acid, 2-methacrylamide-2-methylpropanesulfonic acid, 2-methacrylamide-2-methylbutanesulfonic acid); monomers having a phosphoric acid group such as 2-(meth)acryloyloxyethylphosphoric acid; and alkali metal salts, alkaline-earth metal salts, halides, and ammonium salts thereof.

Specific examples of the monomer having a nonionic functional group include: monomers having an alcohol group such as vinyl alcohol, allyl alcohol, and 2-hydroxyethyl acrylate; monomers having an amide group such as acrylamide and methacrylamide; monomers having an alkoxy group such as methyl acrylate, methyl methacrylate, vinyl acetate, allyl acetate, allyl acetoacetate, vinyl trimethylacetate, vinyl formic acid, vinyl hexanoate, vinyl laurate, vinyl methacrylate, vinyl octanoate, vinyl palmitate, vinyl pivalate, vinyl propionate, vinyl stearate, mono-2-(methacryloyloxy)ethyl hexahydrophthalate, mono-2-(methacryloyloxy)ethyl phthalate, vinyl benzoate, p-vinylbenzoic acid, vinyl butyrate, vinyl caprate, vinyl caproate, vinyl crotonate, vinyl decanoate, vinyl cinnamate, allyl butyrate, allyl benzoate, allyl n-butyrate, allyl n-caprate, allyl n-caproate, allyl enanthate, allyl heptanoate, allyl isophthalate, allyl isothiocyanate, allyl isovalerate, and allyl n-valerate; monomers having a lactam group such as vinylpyrrolidone; and monomers having a glycol group such as methoxyethylene glycol methacrylate, methoxypropylene glycol methacrylate, methoxypolyethylene glycol methacrylate, methoxyethylene glycol acrylate, methoxypropylene glycol acrylate, and methoxypolyethylene glycol acrylate. It is preferred that the monomer having a nonionic functional group has little interaction with a metal to be polished and is highly hydrophilic.

The amount of the water-soluble polymer having a weight-average molecular weight of 8,000 or higher and having an anionic functional group and a nonionic functional group contained in the metal-polishing liquid of the present invention is preferably 0.05 to 2.0% by mass, more preferably 0.1 to 0.8% by mass relative to the total mass of the metal-polishing liquid. When the amount of the water-soluble polymer is 0.05% by mass or higher, a practical-level polishing rate tends to be achieved, and when the amount of the water-soluble polymer is 2.0% by mass or less, deterioration of flatness of a polished surface and generation of deposits during polishing tend to be suppressed.

Figure 2:
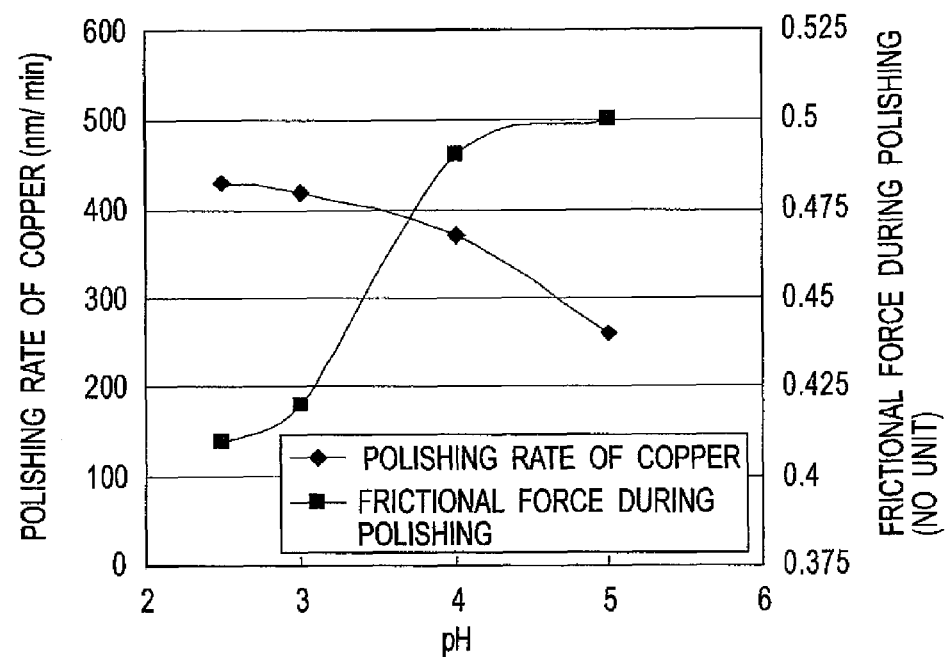
FIG. 2 is a graph obtained by plotting the relationship between the pH and a polishing rate, and the relationship between the pH and a frictional force during polishing by CMP when polishing was performed using the metal-polishing liquid containing a water-soluble polymer (weight-average molecular weight: 55,000) having a carboxylic acid group as an anionic functional group and an amide group as a nonionic functional group and having a ratio of the number of nonionic functional groups to the total number of functional groups of 10%.
Figure 3:
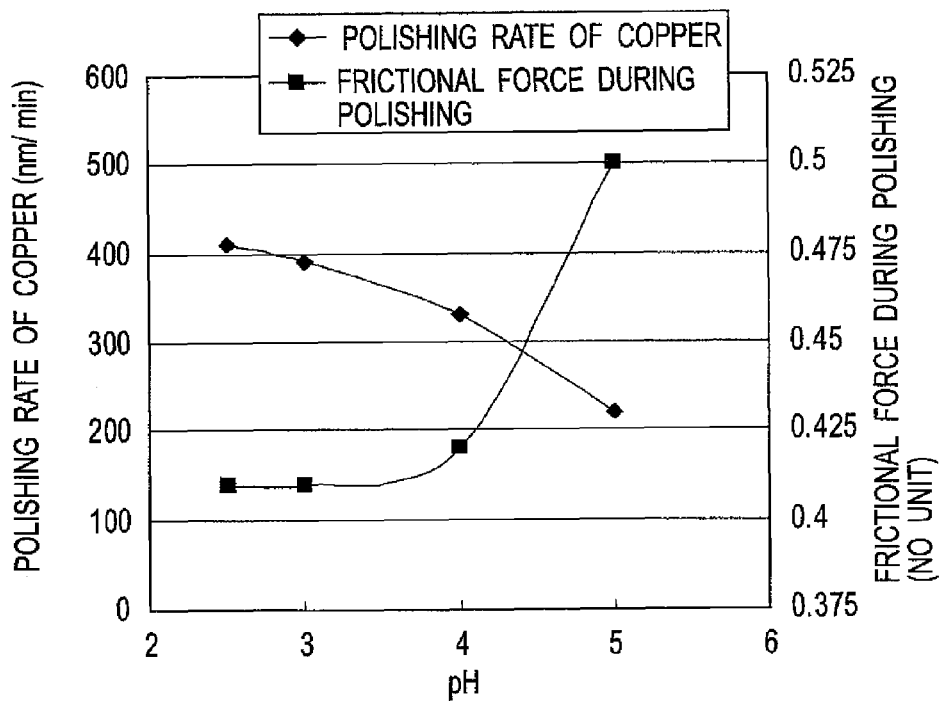
FIG. 3 is a graph obtained by plotting the relationship between the pH and a polishing rate, and the relationship between the pH and a frictional force during polishing by CMP when polishing was performed using the metal-polishing liquid containing a water-soluble polymer (weight-average molecular weight: 61,000) having a carboxylic acid group as an anionic functional group and an amide group as a nonionic functional group and having a ratio of the number of nonionic functional groups to the total number of functional groups of 30%.
Figure 4:
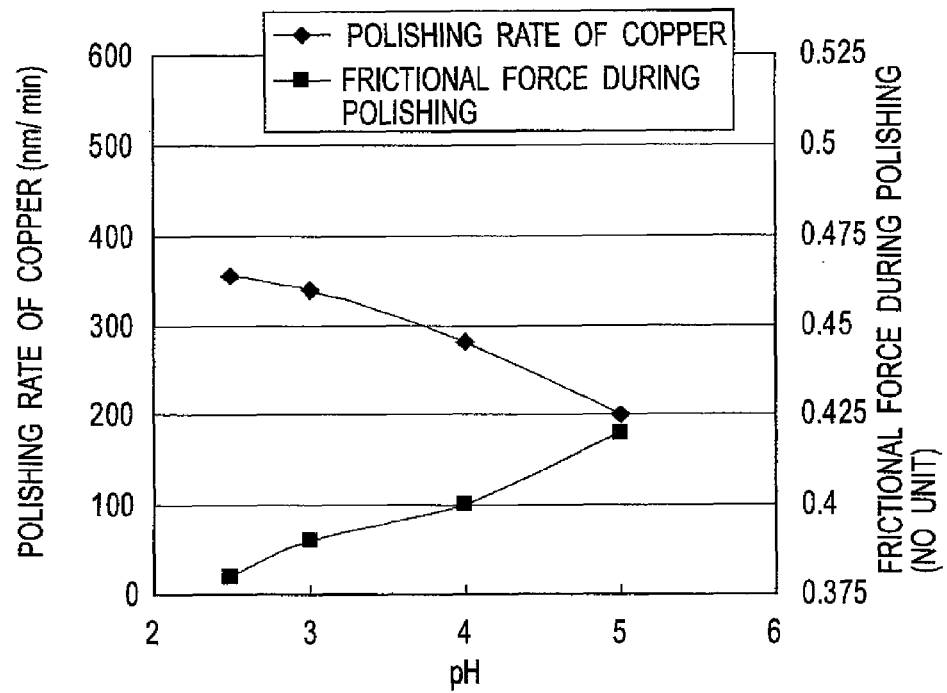
FIG. 4 is a graph obtained by plotting the relationship between the pH and a polishing rate, and the relationship between the pH and a frictional force during polishing by CMP when polishing was performed using the metal-polishing liquid containing a water-soluble polymer (weight-average molecular weight: 52,000) having a carboxylic acid group as an anionic functional group and an amide group as a nonionic functional group and having a ratio of the number of nonionic functional groups to the total number of functional groups of 50%.

FIGS. 1 to 4 are graphs each obtained by plotting the relationship between the pH of a metal-polishing liquid containing a water-soluble polymer (which will be described later) and a polishing rate, and the relationship between the pH of the metal-polishing liquid and a frictional force during polishing by CMP when polishing was performed using the metal-polishing liquid. More specifically, FIG. 1 shows a case where a metal-polishing liquid containing a water-soluble polymer (weight-average molecular weight: 65,000) having a carboxylic acid group as an anionic functional group and having no nonionic functional group was used. FIG. 2 shows a case where a metal-polishing liquid containing a water-soluble polymer (weight-average molecular weight: 55,000) having a carboxylic acid group as an anionic functional group and an amide group as a nonionic functional group and having a ratio of the number of nonionic functional groups to the total number of functional groups of 10% was used. FIG. 3 shows a case where a metal-polishing liquid containing a water-soluble polymer (weight-average molecular weight: 61,000) having a carboxylic acid group as an anionic functional group and an amide group as a nonionic functional group and having a ratio of the number of nonionic functional groups to the total number of functional groups of 30% was used. FIG. 4 shows a case where a metal-polishing liquid containing a water-soluble polymer (weight-average molecular weight: 52,000) having a carboxylic acid group as an anionic functional group and an amide group as a nonionic functional group and having a ratio of the number of nonionic functional groups to the total number of functional groups of 50% was used.

Each of these metal-polishing liquids used here contains, in addition to the water-soluble polymer, hydrogen peroxide as a metal-oxidizing agent, phosphoric acid as a metal-oxide-dissolving agent, and benzotriazole as a metal anticorrosive.

As can be seen from FIGS. 1 to 4, in each of the cases shown in FIGS. 2 and 3 where the metal-polishing liquid containing a water-soluble polymer having an anionic functional group and a nonionic functional group was used, a frictional force during polishing by CMP is smaller as compared to the case shown in FIG. 1 where the metal-polishing liquid containing a water-soluble polymer having a carboxylic acid group as an anionic functional group and having no nonionic functional group was used. Further, it has been found that the ratio of the number of nonionic functional groups exerting the effect thereof to the total number of functional groups changes depending on the selected pH of the metal-polishing liquid.

More specifically, as can be seen from FIGS. 1 to 4, a lower pH gives a higher polishing rate of copper and a smaller frictional force during polishing. When the ratio of the number of nonionic functional groups to the total number of functional groups is larger within a range of 5 to 60%, the polishing rate of copper is slightly reduced, but the effect of suppressing a frictional force during polishing is enhanced.

It can be considered that a water-soluble polymer having an anionic functional group contained in a metal-polishing liquid interacts with the ion of a metal to be polished when the anionic functional group is ionically dissociated. In this case, it can be estimated that the water-soluble polymers having an anionic functional group are associated with each other via the ion of the metal to be polished and therefore a reaction product having a higher apparent molecular weight is formed on the surface of the metal to be polished (hereinafter, the reaction product will be referred to as a "reaction layer"). Further, it can be considered that when a larger number of molecules of the water-soluble polymer are associated with each other, that is, when the apparent molecular weight of the reaction layer is higher, the mechanical strength of the reaction layer is higher.

In the case of the metal-polishing liquid of the present invention, it is estimated that the suppression of association of molecules of the water-soluble polymer via the ion of a metal to be polished has become possible by allowing the water-soluble polymer to have an anionic functional group and a nonionic functional group having less interaction with the ion of the metal to be polished than the anionic functional group at a pH of 2.5 or higher, at which the ionic dissociation of an anionic functional group of a water-soluble polymer having an anionic functional group is thought to be promoted. From this, it can be estimated that as compared to a reaction layer formed by a water-soluble polymer having only an anionic functional group, a reaction layer formed by the metal-polishing liquid of the present invention has a smaller number of molecules of the water-soluble polymer associated with each other and therefore has lower mechanical strength. Further, it can be estimated that adhesive failure between the reaction layer and a polishing pad is likely to occur due to lower mechanical strength of the reaction layer and therefore friction during CMP is reduced.

Figure 5:
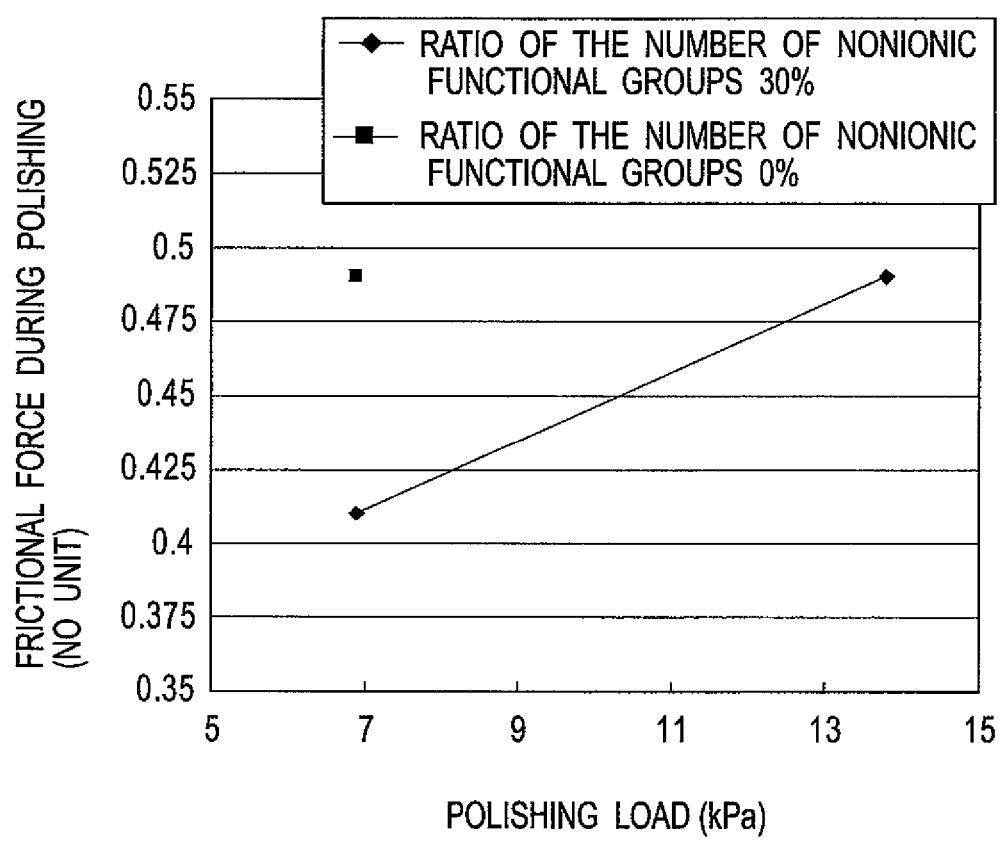
FIG. 5 is a graph showing a frictional force during polishing performed under polishing loads of 6.9 kPa and 13.8 kPa using a metal-polishing liquid having an adjusted pH of 3.0 and containing a water-soluble polymer (weight-average molecular weight: 61,000) having a carboxylic acid group as an anionic functional group and an amide group as a nonionic functional group and having a ratio of the number of nonionic functional groups to the total number of functional groups of 30% and a frictional force during polishing performed under a polishing load of 6.9 kPa using a metal-polishing liquid having an adjusted pH of 3.0 and containing a water-soluble polymer (weight-average molecular weight: 65,000) having a carboxylic acid group as an anionic functional group and having no nonionic functional group.

FIG. 5 is a graph obtained by plotting a frictional force during polishing performed under a predetermined polishing load with the use of a metal-polishing liquid containing a water-soluble polymer and having an adjusted pH of 3.0 (which will be described below). In the graph shown in FIG. 5, the symbol "♦" represents a case where polishing was performed under polishing loads of 6.9 kPa and 13.8 kPa with the use of a metal-polishing liquid containing a water-soluble polymer (weight-average molecular weight: 61,000) having a carboxylic acid group as an anionic functional group and an amide group as a nonionic functional group and having a ratio of the number of nonionic functional groups to the total number of functional groups of 30%, and the symbol "■" represents a case where polishing was performed under a polishing load of 6.9 kPa with the use of a metal-polishing liquid containing a water-soluble polymer (weight-average molecular weight: 65,000) having a carboxylic acid group as an anionic functional group and having no nonionic functional group. As can be seen from FIG. 5, a frictional force when polishing was performed under a polishing load of 13.8 kPa with the use of a metal-polishing liquid containing a water-soluble polymer (weight-average molecular weight: 61,000) having a carboxylic acid group as an anionic functional group and an amide group as a nonionic functional group and having a ratio of the number of nonionic functional groups to the total number of functional groups of 30% is substantially the same as a frictional force when polishing was performed under a polishing load of 6.9 kPa with the use of a metal-polishing liquid containing a water-soluble polymer (weight-average molecular weight: 65,000) having a carboxylic acid group as an anionic functional group and having no nonionic functional group.

The metal-polishing liquid of the present invention can contain abrasive grains. By adding abrasive grains to the metal-polishing liquid, it is possible to further increase a polishing rate. However, there is a possibility that addition of abrasive grains increases the amount of dishing, and therefore the amount of abrasive grains contained in the metal-polishing liquid is appropriately selected insofar as the effects of the present invention are not impaired. The amount of abrasive grains contained in the metal-polishing liquid is preferably 1% by mass or less, more preferably 0.001 to 1% by mass, particularly preferably 0.03 to 1% by mass relative to the total mass of the metal-polishing liquid. If the amount of abrasive grains contained in the metal polishing liquid exceeds 1% by mass, the amount of dishing tends to be increased. The lower limit of the amount of abrasive grains contained in the metal-polishing liquid is not particularly limited, but for example, if the amount of abrasive grains contained in the metal-polishing liquid is less than 0.001% by mass, the addition of abrasive grains tends not to contribute to an increase in polishing rate and therefore has little effect.

It is generally known that addition of abrasive grains increases a polishing rate, but on the other hand, addition of abrasive grains tends to also increase a frictional force during polishing. However, as described above, the metal-polishing liquid of the present invention contains a water-soluble polymer having a weight-average molecular weight of 8,000 or higher and having an anionic functional group and a nonionic functional group, and therefore even when abrasive grains are added to the metal-polishing liquid of the present invention, it is possible to increase a polishing rate without increasing a frictional force during polishing.

Examples of abrasive grains to be used in the present invention include inorganic abrasive grains such as silica, alumina, titania, ceria, zirconia, and germania, and organic abrasive grains such as polystyrene, polyacryl, and polyvinyl chloride. Among them, silica, alumina, and ceria are preferred, and colloidal silica and/or colloidal silica derivatives are more preferred. Further, the electric potential of the abrasive grains may be adjusted by adding trace amounts of metal species or by surface modification. A method for adjusting the electric potential of the abrasive grains is not particularly limited. Here, the term "colloidal silica derivative" refers to a colloidal silica-based material obtained by, for example, adding trace amounts of metal species in a sol-gel reaction or chemically modifying a silanol group on the surface thereof. A method for preparing a colloidal silica derivative is not particularly limited. These various kinds of abrasive grains can be used singly or in combination of two or more of them.

Colloidal silica can be produced by a well-known method such as hydrolysis of silicon alkoxide or ion exchange of sodium silicate. However, from the viewpoints of particle size controllability and an alkali-metal impurity content, the method where silicon alkoxide such as tetramethoxysilane or tetraethoxysilane is hydrolyzed, is used most often. Colloidal alumina can be produced by a well-known method such as hydrolysis of aluminum nitrate.

The primary particle size of abrasive grains to be used in the present invention is appropriately adjusted according to, the kind of metal to be polished, the kind of the abrasive grains, etc., but is preferably 200 nm or less, more preferably 5 to 200 nm, even more preferably 5 to 150 nm, particularly preferably 5 to 100 nm. If the primary particle size of the abrasive grains exceeds 200 nm, a polished surface tends to be poor in flatness. In a case where abrasive grains having a primary particle size of less than 5 nm are selected, attention should be taken because there is a possibility that a CMP rate is lowered.

In a case where the abrasive grains are associated with each other, the secondary particle size of the abrasive grains is preferably 200 nm or less, more preferably 10 to 200 nm, even more preferably 10 to 150 nm, particularly preferably 10 to 100 nm. If the secondary particle size of the abrasive grains exceeds 200 nm, a polished surface tends to be poor in flatness. In a case where abrasive grains having a secondary particle size of less than 10 nm are selected, attention should be taken because there is a possibility that a CMP rate is lowered due to the insufficient ability of the abrasive grains to mechanically remove a reaction layer.

The primary particle size of abrasive grains to be used in the present invention can be measured by a transmission electron microscope (e.g., S4700 manufactured by Hitachi, Ltd.). The secondary particle size of the abrasive grains can be measured by an optical diffraction/scattering particle size distribution analyzer (e.g., COULTER N4SD manufactured by COULTER Electronics).

The metal-polishing liquid of the present invention may further contain, in addition to the above-described components, one or more additives usually added to a polishing liquid such as coloring agents (e.g., dyes and pigments), pH adjusting agents, and solvents other than water insofar as beneficial effects of the metal-polishing liquid are not impaired.

A film to be polished using the metal-polishing liquid of the present invention is at least one selected from the group consisting of copper, copper alloys, copper oxides, copper alloy oxides, aluminum, aluminum alloys, aluminum oxides, aluminum alloy oxides, tantalum, tantalum compounds such as tantalum nitride and tantalum alloys, titanium, titanium compounds such as titanium nitride and titanium alloys, tungsten, tungsten compounds such as tungsten nitride and tungsten alloys, ruthenium and ruthenium alloys. The film to be polished may be either a single-layer film or a laminated film having two or more layers. Copper, copper alloys, copper oxides, and copper alloy oxides can be formed into a film by a well-known sputtering method or plating method.

A method for polishing a film to be polished according to the present invention includes polishing a metal film to be polished by moving a polishing table and a substrate having the metal film to be polished relative to each other in a state where the substrate is pressed against a polishing pad of the polishing table while supplying the metal-polishing liquid according to the present invention onto the polishing pad.

Examples of the substrate include substrates for semiconductor device production, for example, substrates obtained by forming an insulating layer on a semiconductor substrate such as a semiconductor substrate having circuit elements and a wiring pattern formed thereon or a semiconductor substrate having circuit elements formed thereon.

As a polishing apparatus used in the polishing method according to the present invention, for example, a commonly-used polishing apparatus with a holder for holding a substrate having a film to be polished and with a polishing table (equipped with a motor capable of changing its rotation speed) having a polishing cloth (pad) bonded thereto can be used. For example, MIRRA manufactured by Applied Materials, Inc. can be used.

The polishing cloth is not particularly limited, and examples thereof include commonly-used non-woven fabrics, foamed polyurethane, and porous fluorine resins. The polishing cloth preferably has trenches for holding the metal-polishing liquid.

Polishing conditions are not particularly limited, but the rotation speed of the polishing table is preferably as low as 200 rpm or less to prevent the substrate from jumping off the table. A polishing load under which the substrate having a film to be polished is pressed against the polishing cloth is preferably 3 to 25 kPa, and is more preferably 5 to 15 kPa from the viewpoints of the uniformity of a polishing rate over the entire surface of the film to be polished and the flatness of a pattern.

In order to move the polishing cloth and the film to be polished relative to each other in a state where the substrate having the film to be polished is pressed against the polishing cloth, it is only necessary to move at least one of the substrate and the polishing table. At this time, polishing can be performed not only by rotating the polishing table but also by rotating or fluctuating the holder. Other examples of such a polishing method include one in which the polishing table is epicyclically rotated and one in which a belt-like polishing cloth is moved linearly in one longitudinal direction. It is to be noted that the holder may be in any of a fixed state, a rotated state, and a fluctuated state. An appropriate polishing method can be selected from these polishing methods according to the type of surface to be polished or the type of polishing apparatus to be used insofar as the polishing cloth and the metal film to be polished can be moved relative to each other.

During polishing, the metal-polishing liquid of the present invention is preferably supplied continuously onto the polishing cloth by, for example, a pump. The amount of the metal-polishing liquid to be supplied is not particularly limited, but it is preferred that the surface of the polishing cloth is always covered with the metal-polishing liquid. More specifically, the amount of the metal-polishing liquid to be supplied is preferably 0.3 to 0.9 mL per square centimeter of the polishing cloth.

After the completion of polishing, it is preferred that the substrate is washed thoroughly with flowing water and is then dried by removing water droplets from the surface thereof by, for example, a spin dryer.

The metal-polishing liquid of the present invention is particularly suitable for polishing films to be polished for LSI, but can also be used to polish films to be polished for other purposes.

When a film to be polished is polished using a metal-polishing liquid of the present invention, the metal-polishing liquid to be used is preferably prepared in the following manner. First, a metal-polishing liquid having a known composition is prepared, and then the film to be polished is polished using the metal-polishing liquid having a known composition at various pHs to previously determine changes in a polishing rate and a frictional force during polishing with a change in the pH of the metal-polishing liquid. Then, based on the result, the pH of the metal-polishing liquid, the ratio of the number of nonionic functional groups to the total number of functional groups of the water-soluble polymer, and/or the abrasive grain content of the metal-polishing liquid are/is appropriately adjusted so that the film to be polished can be polished at desired polishing rate and frictional force.

EXAMPLES

Hereinbelow, the present invention will be described with reference to the following examples, but it is to be noted that the present invention is not limited thereto.

(Water-Soluble Polymer)

Water-soluble polymers (a) to (k) used in Examples 1 to 9 and Comparative Examples 1 to 8 were each obtained by polymerizing a monomer having an anionic functional group shown in Table 1 and a monomer having a nonionic functional group shown in Table 1. The kind of anionic functional group, the kind of nonionic functional group, the weight-average molecular weight, the ratio (percentage) of the number of anionic functional groups to the total number of functional groups, and the ratio (percentage) of the number of nonionic functional groups to the total number of functional groups of each of the water-soluble polymers are shown in Table 1.

TABLE 1

| Water-soluble polymer | | (a) | (b) | (c) | (d) | (e) | (f) | (g) | (h) | (i) | (k) |
|---|---|---|---|---|---|---|---|---|---|---|---|
| Anionic functional group | Carboxylic acid group | 90% | 70% | 70% | 50% | 70% | 70% | 70% | 100% | 0% | 90% |
| Nonionic functional group | Amide group | 10% | 30% | 30% | 50% | 0% | 0% | 0% | 0% | 100% | 100% |
| | Methoxy group | 0% | 0% | 0% | 0% | 30% | 0% | 0% | 0% | 0% | 0% |
| | Alcohol group | 0% | 0% | 0% | 0% | 0% | 30% | 0% | 0% | 0% | 0% |
| | Pyrolidone group | 0% | 0% | 0% | 0% | 0% | 0% | 30% | 0% | 0% | 0% |
| Weight-average molecular weight | | 55000 | 61000 | 300000 | 52000 | 82000 | 75000 | 64000 | 65000 | 100000 | 6500 |

The weight-average molecular weight of each of the water-soluble polymers was measured by gel permeation chromatography. The measurement conditions are as follows.

Pump: Model L-6000 manufactured by Hitachi, Ltd.
Detector: R1 detector L-3300 manufactured by Hitachi, Ltd.

Column: Gelpack GL-W500 manufactured by Hitachi, Ltd.

Column Size: 10.7 mm (φ)×300 mm

Eluent: 100 mM phosphate buffer (pH=6.8)/acetonitrile 90/10 (vol %)

Liquid-Sending Pressure: 17 kgf/cm$^2$

Flow Rate of Eluent: 1.0 mL/min

Amount of Sample for Measurement: 50 μL

Calibration Curve: polyethylene glycol/polyethylene oxide

Example 1

With respect to the total mass of a polishing liquid, 30% by mass of a 30% (by mass) aqueous hydrogen peroxide solution (Guaranteed Reagent), 0.2% by mass of phosphoric acid, 0.2% by mass of benzotriazole, 0.15% by mass of citric acid, 0.08% by mass of 1,2,4-triazole, and 0.2% by mass of the water-soluble polymer (a) shown in Table 1 were mixed together, and then pure water was added thereto so that the total mass percentage was 100. Then, aqueous ammonia having a concentration of 28 to 30% by mass was added thereto to adjust the pH to 3 to prepare a polishing liquid (A).

Example 2

A polishing liquid (B) was prepared in the same manner as in Example 1 except that the water-soluble polymer (a) was changed to the water-soluble polymer (b).

Example 3

A polishing liquid (C) was prepared in the same manner as in Example 1 except that the water-soluble polymer (a) was changed to the water-soluble polymer (c).

Example 4

A polishing liquid (D) was prepared in the same manner as in Example 1 except that the water-soluble polymer (a) was changed to the water-soluble polymer (d).

Example 5

A polishing liquid (E) was prepared in the same manner as in Example 1 except that the water-soluble polymer (a) was changed to the water-soluble polymer (e).

Example 6

A polishing liquid (F) was prepared in the same manner as in Example 1 except that the water-soluble polymer (a) was changed to the water-soluble polymer (f).

Example 7

A polishing liquid (G) was prepared in the same manner as in Example 1 except that the water-soluble polymer (a) was changed to the water-soluble polymer (g).

Example 8

A polishing liquid (H) was prepared in the same manner as in Example 1 except that the water-soluble polymer (a) was changed to the water-soluble polymer (b) and that the pH was adjusted to 4.

Example 9

With respect to the total mass of a polishing liquid, 30% by mass of a 30% (by mass) aqueous hydrogen peroxide solution (Guaranteed Reagent), 0.2% by mass of phosphoric acid, 0.2% by mass of benzotriazole, 0.15% by mass of citric acid, 0.08% by mass of 1,2,4-triazole, 0.2% by mass of the water-soluble polymer (b) shown in Table 1, and 0.05% by mass of colloidal silica abrasive grains having a median size of 60 nm were mixed together, and then pure water was added thereto so that the total mass percentage was 100. Then, aqueous ammonia having a concentration of 28 to 30% by mass was added thereto to adjust the pH to 3 to prepare a polishing liquid (I).

It is to be noted that the colloidal silica was prepared by hydrolysis of tetraethoxysilane in an ammonia solution.

Comparative Example 1

A polishing liquid (J) was prepared in the same manner as in Example 1 except that the water-soluble polymer (a) was changed to the water-soluble polymer (h).

Comparative Example 2

A polishing liquid (K) was prepared in the same manner as in Example 1 except that the water-soluble polymer (a) was changed to the water-soluble polymer (i).

Comparative Example 3

A polishing liquid (L) was prepared in the same manner as in Example 1 except that the water-soluble polymer (a) was changed to the water-soluble polymer (h) and that the pH was adjusted to 4.

Comparative Example 4

A polishing liquid (M) was prepared in the same manner as in Example 1 except that the water-soluble polymer (a) was changed to the water-soluble polymer (h) and that the pH was adjusted to 2.

Comparative Example 5

A polishing liquid (N) was prepared in the same manner as in Example 9 except that the water-soluble polymer (b) was changed to the water-soluble polymer (h).

Comparative Example 6

A polishing liquid (O) was prepared in the same manner as in Example 1 except that the water-soluble polymer (a) was changed to the water-soluble polymer (k).

Comparative Example 7

A polishing liquid (P) was prepared in the same manner as in Example 1 except that the pH was adjusted to 2.

Comparative Example 8

A polishing liquid (Q) was prepared in the same manner as in Example 1 except that the pH was adjusted to 6.

Polishing was performed using each of the polishing liquids (A) to (Q) obtained in Examples 1 to 9 and Comparative Examples 1 to 8 to evaluate the performance of the polishing liquids (A) to (Q) in the following manner. The evaluation results are shown in Tables 2 and 3.

(Polishing Conditions)

Substrate (I): Unpatterned Silicon Substrate

An insulating film layer of silicon dioxide was formed on the surface of a silicon substrate, and then a 15 nm-thick TaN film, a 10 nm thick Ta film, and a 100 nm-thick copper film were formed by sputtering, and then a 1.5 μm-thick copper film was deposited by electrolytic plating to obtain a substrate to be polished.

Substrate (II): Patterned Silicon Substrate

An insulating film layer of silicon dioxide was formed on the surface of a silicon substrate, and then a wiring trench pattern was formed in the insulating film layer of silicon dioxide with the use of a SEMATECH 854 mask. Then, a 15 nm-thick TaN film, a 10 nm-thick Ta film, and a 100 nm-thick copper film were formed by sputtering, and then a 1.1 μm thick copper film was deposited by electrolytic plating to obtain a substrate to be polished. The wiring trench had a depth of 500 nm. The thus obtained patterned silicon substrate was chemically-mechanically polished or electrolytically polished until the thickness of the copper film became 250 nm so that the difference in surface level of the copper film between a wiring area with a width of 100 μm and an area other than the wiring area was 20 nm or less. The thus pretreated patterned silicon substrate was used to evaluate the performance of the metal-polishing liquids.

(Evaluation Items of Polishing Liquids)

(1) Frictional force during polishing: An operating current value of a motor for driving a polishing table of a polishing apparatus (MIRRA manufactured by Applied Materials, Inc.) was outputted as an analog signal (voltage (V)) and read by a recorder NR-250 manufactured by Keyence. The average of readings was defined as a frictional force. The thus determined frictional force values were relatively compared.

(2) Copper polishing rate: The Substrate (I) was polished for 60 seconds under the above-described polishing conditions while each of the polishing liquids (A) to (Q) was supplied onto a polishing cloth. The difference in the thickness of the copper film before and after polishing was determined from a change in electrical resistance.

(3) Dishing amount: The Substrate (II) was polished under the above-described polishing conditions while each of the polishing liquids (A) to (Q) was supplied onto a polishing cloth. It is to be noted that polishing was performed for 30 seconds as over-polishing (additional polishing) after excess copper was completely removed from the wafer. The amount of reduction in film thickness in a wiring metal area was measured with reference to the surface level of an insulating film area using a contact profilometer (DECKTAK V200-Si manufactured by Veeco).

(4) Polishing scratches: After the completion of CMP, the substrate was observed with the visual contact, an optical microscope, and an electronic microscope to determine the presence or absence of polishing scratches.

TABLE 2

|  | Examples | | | | | | | | |
| --- | --- | --- | --- | --- | --- | --- | --- | --- | --- |
|  | 1 | 2 | 3 | 4 | 5 | 6 | 7 | 8 | 9 |
| Metal-polishing liquid | (A) | (B) | (C) | (D) | (E) | (F) | (G) | (H) | (I) |
| Water-soluble polymer | (a) | (b) | (c) | (d) | (e) | (f) | (g) | (b) | (b) |
| pH | 3.0 | 3.0 | 3.0 | 3.0 | 3.0 | 3.0 | 3.0 | 4.0 | 3.0 |
| Polishing rate (nm/min.) | 420 | 390 | 400 | 340 | 370 | 390 | 400 | 330 | 480 |
| Frictional force during polishing (no unit) | 0.42 | 0.41 | 0.43 | 0.39 | 0.44 | 0.42 | 0.42 | 0.42 | 0.40 |
| Dishing amoung (nm) | 45 | 30 | 50 | 25 | 60 | 45 | 40 | 40 | 90 |
| Polishing scratches | undetected | undetected | undetected | undetected | undetected | undetected | undetected | undetected | undetected |

TABLE 3

|  | Comparative Examples | | | | | | | |
| --- | --- | --- | --- | --- | --- | --- | --- | --- |
|  | 1 | 2 | 3 | 4 | 5 | 6 | 7 | 8 |
| Metal-polishing liquid | (J) | (K) | (L) | (M) | (N) | (O) | (P) | (Q) |
| Water-soluble polymer | (h) | (i) | (h) | (h) | (h) | (k) | (a) | (a) |
| pH | 3.0 | 3.0 | 4.0 | 2.0 | 3.0 | 3.0 | 2.0 | 6.0 |
| Polishing rate (nm/min.) | 465 | 10 | 400 | 470 | 550 | 30 | 420 | 80 |
| Frictional force during polishing (no unit) | 0.49 | 0.34 | 0.50 | 0.41 | 0.48 | 0.36 | 0.41 | 0.48 |
| Dishing amoung (nm) | 90 | — | 100 | 80 | 140 | — | 70 | — |
| Polishing scratches | undetected | — | undetected | undetected | undetected | — | undetected | — |

(CMP Polishing Conditions)

Polishing apparatus: MIRRA manufactured by Applied Materials, Inc.
  Polishing load: 6.9 kPa
  Supply rate of polishing liquid: 200 mL/min
  Rotation speed of polishing table: 93 rpm
  Rotation speed of head with wafer: 87 rpm
(Cleaning after CMP)

After the completion of CMP, each of the substrates was washed with a brush in PVA and ultrasonicated water, and was then dried by a spin dryer.

As can be seen from Tables 2 and 3, the polishing liquids (A) to (H) of Examples 1 to 8 can achieve a smaller frictional force during polishing and a smaller dishing amount as compared to the polishing liquid (J) of Comparative Example 1 containing the water-soluble polymer (h) having no nonionic functional group. Further, it has been found that the polishing liquid (H) of Example 8 having a pH of 4.0 and containing the water-soluble polymer (b) can achieve a smaller frictional force during polishing and a smaller dishing amount as compared to the polishing liquid (L) of Comparative Example 3 having a pH of 4.0 and containing the water-soluble polymer (h) having no nonionic functional group.

Further, it has been found that the polishing liquid (I) of Example 9 containing colloidal silica abrasive grains and the water-soluble polymer (b) can achieve a smaller frictional force during polishing and a smaller dishing amount as compared to the polishing liquid (N) of Comparative Example 5 containing colloidal silica abrasive grains and the water-soluble polymer (h) having no nonionic functional group. Further, it has been found that the polishing liquid (K) of Comparative Example 2 containing the water-soluble polymer (i) having no anionic functional group cannot achieve a practical-level polishing rate. Further, it has been found that in the case of using the polishing liquid (M) of Comparative Example 4 having a pH of 2.0 and containing the water-soluble polymer (h) having no nonionic functional group, the frictional force during polishing is low but the dishing amount is large. Further, it has been found that the polishing liquid (O) of Comparative Example 6 containing the water-soluble polymer (k) having a weight-average molecular weight of 6500 cannot achieve a practical-level polishing rate. Further, it has been found that in the case of using the polishing liquid (P) of Comparative Example 7 containing the water-soluble polymer (a) and having a pH of 2.0, the dishing amount is larger as compared to the case of using the polishing liquid (A) of Example 1. Further, it has been found that unlike the polishing liquid (A) of Example 1, the polishing liquid (Q) of Comparative Example 8 containing the water-soluble polymer (a) and having a pH of 6.0 cannot achieve a practical-level polishing rate.

It is to be noted that the polishing liquids (K), (O), and (Q) of Comparative Examples 2, 6, and 8 could not achieve a practical-level polishing rate, and therefore the evaluation of the dishing amount and the evaluation of the presence or absence of polishing scratches were not performed on the polishing liquids (K), (O), and (Q).

INDUSTRIAL APPLICABILITY

According to the present invention, it is possible to provide a metal-polishing liquid and a polishing method using the same capable of achieving a reduced frictional force during polishing by CMP and excellent flatness of a polished surface. Further, it is also possible to avoid the occurrence of problems such as cohesive failure of a Low-k film itself and interface delamination between a Low-k film and a film other than the Low-k film, thereby enabling embedded wiring with excellent flatness and with high reliability to be formed.

The invention claimed is:
1. A method for polishing a film to be polished, comprising polishing a metal film to be polished by using a metal-polishing liquid comprising: a metal-oxide-dissolving agent; a metal-oxidizing agent; a metal anticorrosive; a water-soluble polymer having a weight-average molecular weight of 8,000 or higher and having an anionic functional group and a nonionic functional group; and water, and having a pH within the range of 2.5 or higher but 5.0 or less,
wherein the metal-polishing liquid comprises no abrasive grains.
2. The method according to claim 1, wherein the water-soluble polymer having an anionic functional group and a nonionic functional group has at least one anionic functional group selected from the group consisting of a sulfonic acid group, a carboxylic acid group, a phosphoric acid group, and salts thereof.
3. The method according to claim 1, wherein the water-soluble polymer having an anionic functional group and a nonionic functional group has at least one nonionic functional group selected from the group consisting of an alcohol group, an amide group, an alkoxy group, a glycol group, and a lactam group.
4. The method according to claim 1, wherein the water-soluble polymer having an anionic functional group and a nonionic functional group has a ratio of the number of nonionic functional groups to the total number of functional groups of 5% or higher but 60% or less.
5. The method according to claim 1, wherein the metal-oxidizing agent is at least one selected from the group consisting of hydrogen peroxide, ammonium persulfate, nitric acid, potassium periodate, hypochlorous acid, and ozone water.
6. The method according to claim 1, wherein the metal-oxide-dissolving agent is at least one selected from the group consisting of inorganic acids, organic acids, and salts thereof having a first-step acid dissociation constant at 25° C. of less than 3.7.
7. The method according to claim 1, wherein the metal-oxide-dissolving agent is at least one selected from the group consisting of malonic acid, citric acid, malic acid, glycolic acid, glutamic acid, oxalic acid, tartaric acid, sulfuric acid, nitric acid, phosphoric acid, hydrochloric acid, formic acid, lactic acid, phthalic acid, fumaric acid, maleic acid, aminoacetic acid, amidosulfuric acid and salts thereof.
8. The method according to claim 1, wherein the metal anticorrosive is at least one selected from the group consisting of nitrogen-containing cyclic compounds and ionic surfactants.
9. The method according to claim 1, wherein a metal to be polished is at least one metal selected from the group consisting of copper, copper alloys, copper oxides, and copper alloy oxides.
10. The method according to claim 1, wherein a metal to be polished is at least one metal selected from the group consisting of tantalum, tantalum compounds, titanium, titanium compounds, tungsten, tungsten compounds, ruthenium, and ruthenium compounds.
11. The method according to claim 1, wherein the polishing comprises moving a polishing table and a substrate having the metal film to be polished relative to each other in a state where the substrate is pressed against a polishing cloth of the polishing table while supplying the metal-polishing liquid onto the polishing cloth.
12. A method for polishing a film to be polished, comprising polishing a metal film to be polished by using a metal-polishing liquid comprising: a metal-oxide-dissolving agent; a metal-oxidizing agent; a metal anticorrosive; a water-soluble polymer having a weight-average molecular weight of 8,000 or higher and having an anionic functional group and a nonionic functional group; and water, and having a pH within the range of 2.5 or higher but 5.0 or less,
wherein the metal-polishing liquid comprises silica.
13. The method according to claim 12, wherein the water-soluble polymer having an anionic functional group and a nonionic functional group has at least one anionic functional group selected from the group consisting of a sulfonic acid group, a carboxylic acid group, a phosphoric acid group, and salts thereof.
14. The method according to claim 12, wherein the water-soluble polymer having an anionic functional group and a nonionic functional group has at least one nonionic functional group selected from the group consisting of an alcohol group, an amide group, an alkoxy group, a glycol group, and a lactam group.
15. The method according to claim 12, wherein the water-soluble polymer having an anionic functional group and a nonionic functional group has a ratio of the number of nonionic functional groups to the total number of functional groups of 5% or higher but 60% or less.

16. The method according to claim 12, wherein the metal-oxidizing agent is at least one selected from the group consisting of hydrogen peroxide, ammonium persulfate, nitric add, potassium periodate, hypochlorous acid, and ozone water.

17. The method according to claim 12, wherein the metal-oxide-dissolving agent is at least one selected from the group consisting of inorganic acids, organic acids, and salts thereof having a first-step acid dissociation constant at 25° C. of less than 3.7.

18. The method according to claim 12, wherein the metal-oxide-dissolving agent is at least one selected from the group consisting of malonic acid, citric acid, malic acid, glycolic acid, glutamic acid, oxalic acid, tartaric acid, sulfuric acid, nitric acid, phosphoric acid, hydrochloric acid, formic acid, lactic acid, phthalic acid, fumaric acid, maleic acid, aminoacetic acid, amidosulfuric acid and salts thereof.

19. The method according to claim 12, wherein the metal anticorrosive is at least one selected from the group consisting of nitrogen-containing cyclic compounds and ionic surfactants.

20. The method according to claim 12, wherein a metal to be polished is at least one metal selected from the group consisting of copper, copper alloys, copper oxides, and copper alloy oxides.

21. The method according to claim 12, wherein a metal to be polished is at least one metal selected from the group consisting of tantalum, tantalum compounds, titanium, titanium compounds, tungsten, tungsten compounds, ruthenium, and ruthenium compounds.

22. The method according to claim 12, wherein the polishing comprises moving a polishing table and a substrate having the metal film to be polished relative to each other in a state where the substrate is pressed against a polishing cloth of the polishing table while supplying the metal-polishing liquid onto the polishing cloth.

* * * * *